United States Patent …

(12) United States Patent
Feichtinger et al.

(10) Patent No.: US 8,717,120 B2
(45) Date of Patent: May 6, 2014

(54) MULTI-LAYERED COMPONENT

(75) Inventors: Thomas Feichtinger, Graz (AT); Pascal Dotta, Eggersdorf b. Graz (AT); Hannes Schiechl, Graz (AT)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 12/893,183

(22) Filed: Sep. 29, 2010

(65) Prior Publication Data

US 2011/0057747 A1      Mar. 10, 2011

Related U.S. Application Data

(63) Continuation of application No. PCT/EP2009/054459, filed on Apr. 15, 2009.

(30) Foreign Application Priority Data

Apr. 16, 2008   (DE) .......................... 10 2008 019 127

(51) Int. Cl.
*H03H 7/06*    (2006.01)
*H02H 1/00*    (2006.01)
*H02H 9/04*    (2006.01)

(52) U.S. Cl.
USPC .......................................... 333/185; 361/119

(58) Field of Classification Search
USPC ................ 333/12, 185, 172; 338/21; 361/119
See application file for complete search history.

(56) References Cited

U.S. PATENT DOCUMENTS

| | | | |
|---|---|---|---|
| 5,034,709 A * | 7/1991 | Azumi et al. ................. | 333/184 |
| 5,197,170 A | 3/1993 | Senda et al. | |
| 5,453,316 A | 9/1995 | Morii et al. | |
| 5,602,517 A | 2/1997 | Kaneko et al. | |
| 6,346,865 B1 | 2/2002 | Callewaert et al. | |
| 6,400,172 B1 * | 6/2002 | Akram et al. ............ | 324/756.05 |
| 6,853,268 B2 | 2/2005 | Harada | |
| 7,060,350 B2 * | 6/2006 | Takaya et al. ................. | 428/323 |
| 7,085,118 B2 * | 8/2006 | Inoue et al. ................... | 361/119 |
| 7,714,688 B2 | 5/2010 | Korony et al. | |
| 2002/0158741 A1 | 10/2002 | Tomono et al. | |

(Continued)

FOREIGN PATENT DOCUMENTS

| | | |
|---|---|---|
| CN | 101069458 A | 11/2007 |
| DE | 10 2005 025 680 A1 | 4/2006 |

(Continued)

OTHER PUBLICATIONS

Aleksić, O. S., et al., "Thick Film LC and LCV Cell Arrays," 20th International Conference on Microelectronics Proceedings, Sep. 12-14, 1995, pp. 85-88, vol. 1, IEEE.

(Continued)

*Primary Examiner* — Dean O Takaoka
*Assistant Examiner* — Alan Wong
(74) *Attorney, Agent, or Firm* — Slater & Matsil, L.L.P.

(57) ABSTRACT

A multi-layered component is disclosed, including at least one inductive region, wherein the inductive region includes a ferrite ceramic. The inductive region has electrode structures that form at least one inductance. The multi-layered component has at least one capacitive region, wherein at least one capacitive region includes a varistor ceramic. The capacitive region forms at least one capacitance. At least one inductive region and at least one capacitive region form at least one LC filter.

8 Claims, 3 Drawing Sheets

(56) References Cited

U.S. PATENT DOCUMENTS

| | | | |
|---|---|---|---|
| 2002/0185055 A1* | 12/2002 | Oka | 117/36 |
| 2006/0077646 A1 | 4/2006 | Ahn et al. | |
| 2007/0063330 A1 | 3/2007 | Park et al. | |
| 2007/0069836 A1* | 3/2007 | Sato et al. | 333/185 |
| 2007/0096328 A1 | 5/2007 | Takahashi et al. | |
| 2007/0268647 A1* | 11/2007 | Terada et al. | 361/118 |
| 2007/0271782 A1* | 11/2007 | Block et al. | 29/843 |
| 2009/0097219 A1* | 4/2009 | Cho et al. | 361/763 |

FOREIGN PATENT DOCUMENTS

| | | |
|---|---|---|
| DE | 10 2008 035 102 A1 | 2/2010 |
| GB | 2 419 034 A | 4/2006 |
| JP | 04-257111 | 9/1992 |
| JP | 04-257111 A | 9/1992 |
| JP | 04-257112 A | 9/1992 |
| JP | 05-014103 A | 1/1993 |
| JP | 06-045109 A | 2/1994 |
| JP | 2000-077265 A | 3/2000 |
| JP | 2001-160509 A | 6/2001 |
| JP | 2001-338838 A | 12/2001 |
| JP | 2002-057036 A | 2/2002 |
| JP | 2002-151354 A | 5/2002 |
| JP | 2002-222712 A | 8/2002 |
| JP | 2002-246220 A | 8/2002 |
| JP | 2004-006519 A | 1/2004 |
| JP | 2004-203631 A | 7/2004 |
| JP | 2004-296992 A | 10/2004 |
| JP | 2005-347782 A | 12/2005 |
| JP | 2006-115460 A | 4/2006 |
| JP | 2006-210541 A | 8/2006 |
| JP | 2006-311203 A | 11/2006 |
| JP | 2007-500442 A | 1/2007 |
| JP | 2007-281315 A | 10/2007 |
| JP | 2008-507120 A | 3/2008 |
| WO | WO 97/36307 A1 | 10/1997 |
| WO | WO 2006/002615 A2 | 1/2006 |
| WO | WO 2006002615 A2 * | 1/2006 |

OTHER PUBLICATIONS

Wang, X., et al., "Preparation and Magnetic Characterization of the Ferroxplana Ferrites $Ba_3Co_{2-x}Zn_xFe_{24}O_{41}$," Journal of Magnetism and Magnetic Materials, May 1, 2002, pp. 434-439, vol. 246, No. 3, Elsevier.

Pramanik, N. C., et al., "The Effect of Heat Treatment Temperature on the Microstructure and Magnetic Properties of $Ba_2Co_2Fe_{12}O_{22}$ ($Co_2Y$) Prepared by Sol-Gel Method," Materials Letters, Science Direct, 2006, vol. 60, No. 21-22, pp. 2718-2722, Elsevier.

* cited by examiner

MULTI-LAYERED COMPONENT

This application is a continuation of co-pending International Application No. PCT/EP2009/054459, filed Apr. 15, 2009, which designated the United States and was not published in English, and which claims priority to German Application No. 10 2008 019 127.2, filed Apr. 16, 2008, both of which applications are incorporated herein by reference.

BACKGROUND

A multi-layered component comprising a varistor and an LC filter is known from the German patent document 10 2005 025 680 A1.

SUMMARY OF THE INVENTION

In one aspect, the present invention specifies a multi-layered component which allows a broad spectrum of possible LC filter designs.

In one aspect, a multi-layered component is specified, comprising at least one inductive region. The inductive region comprises a ferrite ceramic having electrode structures. The electrode structures form at least one inductance in the inductive region. Preferably, the inductance comprises a coil structure.

The multi-layered component additionally has at least one capacitive region. The capacitive region of the multi-layered component comprises at least one varistor ceramic. At least one capacitance is formed by internal electrodes of the capacitive region.

At least one LC filter is formed by the at least one inductive region and the at least one capacitive region of the multi-layered component.

The electrode structures comprise conductor tracks and plated-through holes.

In one preferred embodiment, the plated-through holes have a conical form. Conical plated-through holes can be produced, for example, by means of conical needles or by means of a laser in the green sheets of a multi-layered component.

Conical plated-through holes make it possible, for example, that wide conductor tracks on a first side of a layer of the multi-layered component can be contact-connected to relatively narrow conductor tracks lying close to one another on a second side of the layer. As a result, a greater configurational freedom is possible in the design of the conductor tracks.

In a further embodiment, by way of example, the conical plated-through holes of two layers lying one above the other can be directed with the vertices toward one another. As a result, by way of example, it is possible to effect a contact-connection from a wide conductor track via a relatively narrow conductor track through to a wide conductor track.

In one preferred embodiment, the varistor ceramic has an ESD (electrostatic discharge) protection function.

The ferrite ceramic can comprise nickel-zinc (NiZn) ferrites. However, it is also possible for the ferrite ceramic to comprise nickel-copper-zinc (NiCuZn) ferrites. In a further embodiment, the ferrite ceramic can also comprise nickel-zinc-cobalt (NiZnCo) ferrites. However, it is also possible for the ferrite ceramic to contain hexagonal ferrites. In possible embodiments, the ferrite ceramic comprises, for example, barium hexaferrite, manganese-zinc ferrite or nickel-zinc ferrite. In one embodiment, for example, barium hexaferrite has a permeability of preferably between 1 and 20. In a further embodiment, for example, the permeability of nickel-zinc ferrite has a value of between 10 and 1000. In a further embodiment, for example, manganese-zinc ferrite has a permeability of preferably between 2000 and 20,000.

In one embodiment, the varistor ceramic of the multi-layered component can comprise a zinc oxide bismuth antimony (ZnO—BiSb) ceramic. However, it is also possible for the varistor ceramic to comprise a zinc oxide praseodymium (ZnOPr) ceramic.

The inductive region of the multi-layered component preferably has conductor tracks running in a plurality of planes and plated-through holes connecting conductor tracks to one another.

The construction of the multi-layered component, with regard to the arrangement of capacitive and inductive regions, is preferably symmetrical with respect to a plane arranged parallel to the layers of the multi-layered component. A symmetrical construction has advantages with regard to the characteristic of the filter, in particular. Furthermore, a symmetrical construction is advantageous in the production of the multi-layered component.

In one preferred embodiment, the construction of the multi-layered component has the following sequence of the ceramic regions: a number of n regions of a varistor ceramic are followed by m regions of a ferrite ceramic, which are in turn followed by n regions of a varistor ceramic, wherein n≥1 and m≥1.

In a further embodiment, the multi-layered component has a construction of the ceramic regions which is constructed by means of n regions of a ferrite ceramic, followed by m regions of a varistor ceramic, followed by n regions of a ferrite ceramic, wherein n≥1 and m≥1.

The multi-layered component can comprise a metal-containing interlayer between the capacitive region and the inductive region. The metal-containing interlayer preferably serves as a diffusion barrier between a capacitive region and an inductive region of the multi-layered component. The metal-containing interlayer approximately completely prevents the diffusion of dopants between the two regions. Without a metal-containing interlayer, for example, dopants from the varistor ceramic could diffuse into the ferrite ceramic or dopants of the ferrite ceramic could diffuse into the varistor ceramic.

In a further embodiment, a capacitive region can have the properties of a multilayer ceramic capacitor (MLCC) that does not have a varistor function, wherein the multi-layered component has at least one further capacitive region comprising a varistor ceramic.

The LC filter formed by the inductive and capacitive regions of the multi-layered component has a pi structure in one embodiment. However, it is also possible for the LC filter to have a T structure.

In a further embodiment, it is possible for a resistor structure to be applied on the surface of the multi-layered component. A resistor structure can be applied on the surface of the multi-layered component by means of a screen printing method, for example. Such an additional resistor makes it possible, for example, for the multi-layered component to have the properties of an RLC filter.

The multi-layered component comprises a plurality of external contacts for making contact with the electrode structures internally in the multi-layered component. In one preferred embodiment, the external contacts are embodied in array form. This can involve a land grid array (LGA) or a ball grid array (BGA).

Very high inductances can be achieved through the use of a ferrite ceramic for the construction of the inductance. In comparison with conventional multi-layered components, ferrite ceramics have a significantly higher permeability. The ferrite ceramics of the multi-layered component preferably have a permeability that is greater than 1. Preferably, the ferrite ceramic has a permeability of between 1 and 20,000.

Through the use of a varistor ceramic in the capacitive region, high capacitances can be achieved on account of the high dielectric constant of the varistor ceramic. A broad spectrum of possible LC filter designs can be realized as a result.

As a result of the construction of the multi-layered component composed of varistor ceramic and ferrite ceramic, ESD protection function and filter function can be integrated in one device. In this case, the ESD protection function is achieved by the use of a varistor ceramic and the filter function is achieved by the use of a ferrite ceramic.

It is possible to arrange a plurality of LC filters in one component as an array. For this purpose, a plurality of LC filters are arranged alongside one another, for example, in a common component.

BRIEF DESCRIPTION OF THE DRAWINGS

The subjects described above will be explained in greater detail on the basis of the following figures and embodiments.

The drawings described below should not be regarded as true to scale. Rather, for the sake of better illustration, individual dimensions may be illustrated as enlarged, reduced in size or even distorted. Elements which are identical to one another or which perform the same functions are designated by the same reference symbols.

Figure 1:
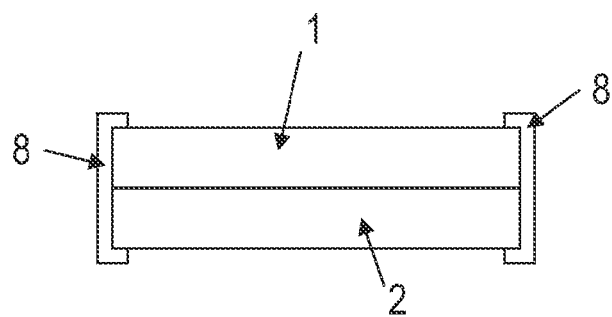
FIG. 1 shows a schematic construction of a first embodiment of a multi-layered component comprising one inductive and one capacitive region.

The following list of reference symbols may be used in conjunction with the drawings:

1 inductive region
2, 2' capacitive region
3 inductance
4 capacitance
5 resistor
6 LC filter
7 interlayer
8 external contacts
9 varistor
10 RLC filter

DETAILED DESCRIPTION OF ILLUSTRATIVE EMBODIMENTS

FIG. 1 shows a schematic construction of a first embodiment of a multi-layered component. The multi-layered component comprises one inductive region 1 and one capacitive region 2. In the embodiment shown, the inductive region 1 comprises a ferrite ceramic containing electrode structures, consisting of conductor tracks and plated-through holes. The electrode structures of the inductive region 1 form at least one coil structure and at least one inductance. The capacitive region 2 preferably comprises a varistor ceramic, wherein the capacitive region 2 forms at least one capacitance and at least one resistance. The inductive region 1 and the capacitive region 2 together form at least one LC filter. The electrical elements of the inductive 1 and capacitive 2 regions are illustrated as an equivalent circuit diagram in FIGS. 5 and 6. The multi-layered component is provided with a plurality of external contacts 8 for connecting the elements externally.

Figure 2:
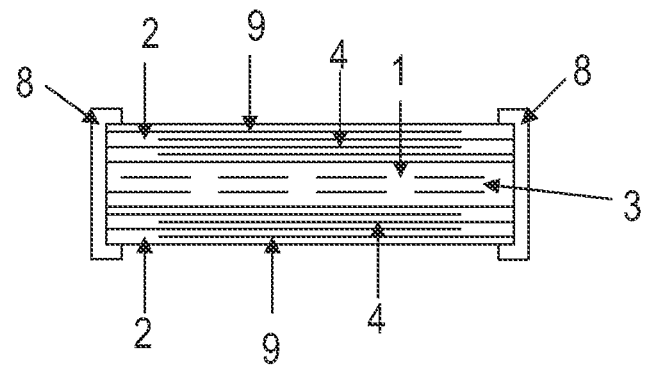
FIG. 2 shows a schematic construction of a further embodiment of a multi-layered component comprising one inductive and two capacitive regions.

FIG. 2 shows a further embodiment of the multi-layered component, wherein the multi-layered component has one inductive region 1 arranged between two capacitive regions 2 and 2'. The first capacitive region 2 can have the function of a varistor, for example. In this case, the second capacitive region 2' can have a purely capacitive function, for example. The symmetrical construction of the multi-layered component simplifies production. Furthermore a symmetrical construction has advantages, for example, with regard to the volumetric expansion of the individual ceramics in the sintering step.

Figure 3:
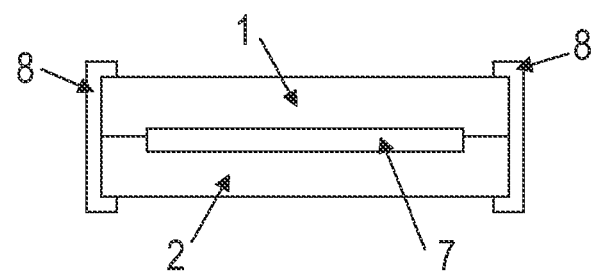
FIG. 3 shows a schematic construction of a further embodiment of a multi-layered component in which an interlayer is arranged between one inductive and one capacitive region.

FIG. 3 illustrates a further embodiment of the multi-layered component in accordance with a construction comparable to that in FIG. 1, in which a metal-containing interlayer 7 is arranged between the inductive region 1 and the capacitive region 2. The interlayer 7 preferably serves as a diffusion barrier between the inductive region 1 and the capacitive region 2.

Figure 4:
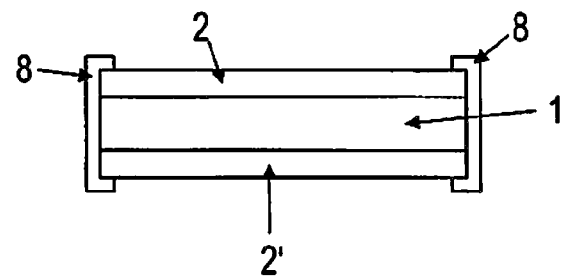
FIG. 4 shows a schematic construction of a further embodiment of a multi-layered component comprising one inductive and two capacitive regions.

FIG. 4 shows a further embodiment of the multi-layered component, wherein the multi-layered component has one inductive region 1 arranged between two capacitive regions 2. A first capacitive region 2 comprises a varistor ceramic. A second capacitive region 2' comprises a Multilayer Ceramic Capacitor (MLCC).

Figure 5:
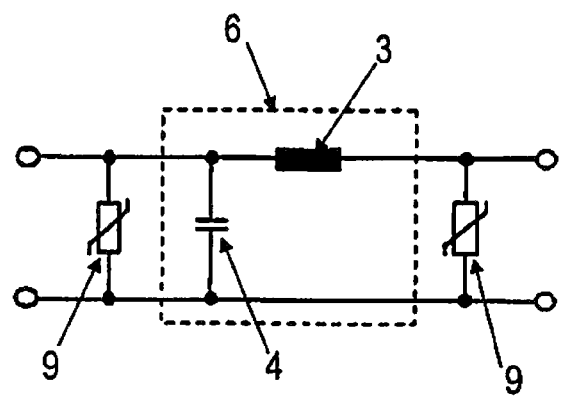
FIG. 5 shows an equivalent circuit diagram of an LC filter.

FIG. 5 illustrates an equivalent circuit diagram of an LC filter of one embodiment of the multi-layered component. The circuit diagram shows an LC filter 6 with two varistors 9 connected in parallel therewith. The LC filter 6 consists of an inductance 3 and a capacitance 4, which are connected in parallel with one another. The inductance 3 is connected in a conduction direction. The capacitance 4 is connected between two lines of the LC filter 6.

Figure 6:
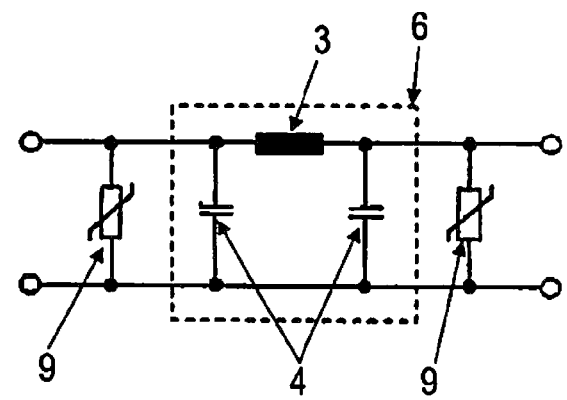
FIG. 6 shows an equivalent circuit diagram of a pi-type LC filter.

FIG. 6 shows an equivalent circuit diagram of an LC filter of a further embodiment of the multi-layered component. The LC filter 6 has the configuration of a pi-type LC filter. The LC filter 6 comprises an inductance 3 and two capacitances 4 connected in parallel with the inductance 3. Two varistors 9 are connected in parallel with the LC filter 6, the varistors 9 serving as ESD protection elements for the LC filter 6.

Figure 7:
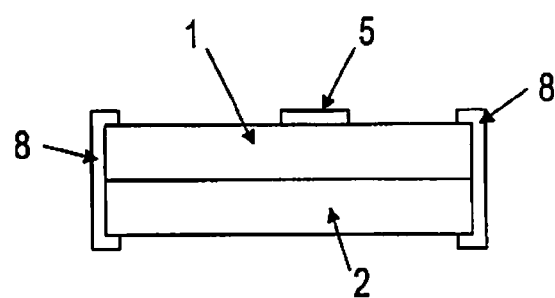
FIG. 7 shows a schematic construction of a further embodiment of a multi-layered component in which a resistor is arranged on the surface.

FIG. 7 illustrates a further embodiment of the multi-layered component in accordance with a construction comparable to that in FIG. 1, in which a resistor 5 is arranged on the surface of the multi-layered component. The resistor 5 can be applied on the surface of the multi-layered component by means of a screen printing method, for example. Preferably, the resistor 5 is connected in series with at least one inductance. The electrical contact-connection of the resistor 5 to the inductance can be effected, for example, by means of plated-through holes or conductor tracks applied on the surface of the multi-layered component. Such an arrangement forms an RLC filter, for example, which is illustrated as an equivalent circuit diagram in FIG. 8. In a further embodiment (not illustrated), it is also possible that further resistors or other electronic components can be applied on the surface of the multi-layered component, which are connected to the LC filter 6. It is also possible to combine the resistor 5 or further electrical component with LC filters 6 which are illustrated in FIGS. 5, 6 and 9.

Figure 8:
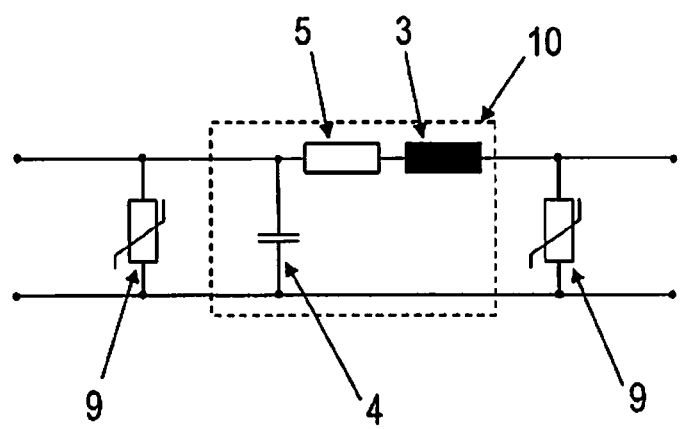
FIG. 8 shows an equivalent circuit diagram of an LC filter with a resistor connected in series with an inductance.

FIG. 8 shows an equivalent circuit diagram of an RLC filter of one embodiment of the multi-layered component. The circuit diagram shows an RLC filter 10 with two varistors 9 connected in parallel therewith. The RLC filter 10 consists of an inductance 3 and a resistor 5, which are connected in series. A capacitance 4 is connected in parallel with the inductance 3 and the resistor 5. The inductance 3 and the resistor 5 are connected in a conduction direction. The capacitance 4 is connected between two lines of the RLC filter 10.

Figure 9:
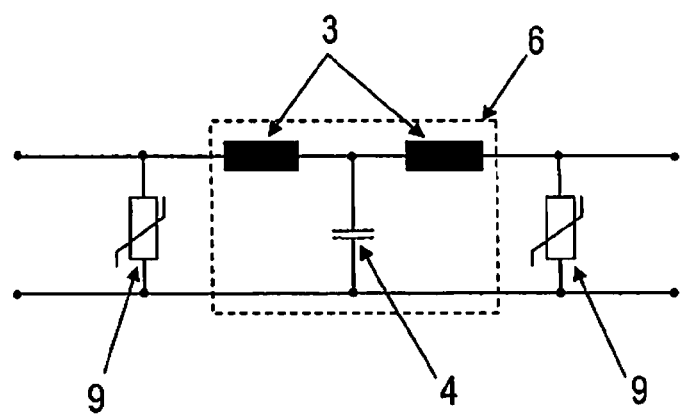
FIG. 9 shows an equivalent circuit diagram of an LC filter having a T structure.

FIG. 9 illustrates an equivalent circuit diagram of an LC filter of a further embodiment of the multi-layered component. The LC filter 6 has the configuration of a T-type LC filter. The LC filter 6 comprises two inductances 3 and a capacitance 4 connected in parallel with the inductances 3. Two varistors 9 are connected in parallel with the LC filter 6.

Although only a restricted number of possible developments of the invention could be described in the embodiments, the invention is not restricted thereto. It is possible, in principle, for the multi-layered component to have a higher number of ceramic regions.

The invention is not restricted to the number of elements illustrated.

The description is not restricted to the individual specific embodiments; rather, the features of the individual embodiments can be combined with one another in any desired manner insofar as is technically expedient.

What is claimed is:

1. A multi-layered component comprising:
   an inductive region comprising a ferrite ceramic and having an electrode structure that forms at least one inductance, wherein the ferrite ceramic comprises a ceramic selected from the group consisting of NiZn ferrites, NiCuZn ferrites, NiZnCo ferrites and hexagonal ferrites;
   a capacitive region comprising a varistor ceramic and forming at least one capacitance; and
   a further capacitive region forming at least one further capacitance; and
   a resistor arranged on a surface of the multi-layered component and connected in series with the inductive region;
   wherein the multi-layered component comprises a symmetric arrangement of the capacitive region, the inductive region and the further capacitive region, the symmetric arrangement comprising the varistor ceramic as dielectric material and the ferrite ceramic as magnetic material having a construction with the following layers:
   n layers of varistor ceramic, followed by
   m layers of ferrite ceramic, followed by
   n layers of varistor ceramic, wherein n and m are numbers and n ≥ 1 and m ≤ 1;
   wherein the symmetric arrangement is symmetrical with respect to a plane that lies parallel to the layers;
   wherein the varistor ceramic comprises a ceramic selected from the group consisting of ZnO—Bi—Sb ceramic and ZnO—Pr;
   wherein the capacitance and the further capacitance are connected in parallel with the inductance in the configuration of a pi-type LC filter; and
   wherein two varistors are connected in parallel with the LC filter, the varistors serving as ESD protection elements for the LC filter.

2. The multi-layered component as claimed in claim 1, wherein the ferrite ceramic comprises NiZn ferrites.

3. The multi-layered component as claimed in claim 1, wherein the ferrite ceramic comprises NiCuZn ferrites.

4. The multi-layered component as claimed in claim 1, wherein the ferrite ceramic comprises NiZnCo ferrites.

5. The multi-layered component as claimed in claim 1, wherein the ferrite ceramic comprises hexagonal ferrites.

6. The multi-layered component as claimed in claim 1, wherein the varistor ceramic comprises a ZnO—Bi—Sb ceramic.

7. The multi-layered component as claimed in claim 1, wherein the varistor ceramic comprises a ZnO—Pr ceramic.

8. The multi-layered component as claimed in claim 1, wherein the resistor has linear properties.

* * * * *

UNITED STATES PATENT AND TRADEMARK OFFICE
CERTIFICATE OF CORRECTION

PATENT NO.         : 8,717,120 B2
APPLICATION NO.    : 12/893183
DATED              : May 6, 2014
INVENTOR(S)        : Thomas Feichtinger et al.

It is certified that error appears in the above-identified patent and that said Letters Patent is hereby corrected as shown below:

In the Claims

In Col. 6, line 14, claim 1, delete "$n \geq 1$ and $m \leq 1$" and insert --$n \geq 1$ and $m \geq 1$--.

Signed and Sealed this
Fifteenth Day of July, 2014

Michelle K. Lee
*Deputy Director of the United States Patent and Trademark Office*